United States Patent [19]

Ohta

[11] 4,426,636

[45] Jan. 17, 1984

[54] METHOD FOR PREVENTING WAVEFORM DISTORTION OF A SIGNAL PASSING THROUGH AN INSULATED CONDUCTOR AND CIRCUIT ELEMENT EMBODYING THE METHOD

[75] Inventor: Kazuho Ohta, Yokohama, Japan

[73] Assignee: Victor Company of Japan, Limited, Yokohama, Japan

[21] Appl. No.: 171,316

[22] Filed: Jul. 23, 1980

[30] Foreign Application Priority Data

Jul. 23, 1979 [JP] Japan .......................... 54-101687[U]

[51] Int. Cl.³ .......................................... H01C 1/012
[52] U.S. Cl. ..................................... 338/314; 29/613
[58] Field of Search ............... 338/214, 314, 275, 334; 29/613, 610; 174/35 R

[56] References Cited

U.S. PATENT DOCUMENTS

| | | | |
|---|---|---|---|
| 2,790,053 | 4/1957 | Peterson .......................... | 338/214 X |
| 3,368,112 | 2/1968 | Hellgren ...................... | 174/35 R X |
| 3,824,328 | 7/1974 | Ting et al. ...................... | 338/275 X |

FOREIGN PATENT DOCUMENTS 2032191 4/1980 United Kingdom ................ 338/275

*Primary Examiner*—C. L. Albritton
*Attorney, Agent, or Firm*—Lowe, King, Price & Becker

[57] ABSTRACT

Waveform distortion of a signal passing through an insulator coated conductor is prevented by the application of a solution containing electrically conductive particles to the surface of the insulative material to form a conductive layer over the surface of the insulator. The conductive layer permits charges to be uniformly dispersed through the insulative material when current is passed through the conductor. The conductive material comprises a mixture of carbon and cellulose in the form of a solution which, upon application to the insulative surface, forms the conductive layer with a strong power of adhesion to the underlying material. The conductive layer partially penetrates into the underlying material to create a gradual variation in the dielectric constant of the insulative material.

10 Claims, 15 Drawing Figures

METHOD FOR PREVENTING WAVEFORM DISTORTION OF A SIGNAL PASSING THROUGH AN INSULATED CONDUCTOR AND CIRCUIT ELEMENT EMBODYING THE METHOD

BACKGROUND OF THE INVENTION

The present invention relates to a method for preventing waveform distortion of electrical signals by applying an electrically conductive coating over the surfaces of insulated electrical wires or circuit elements and to such wires and circuit elements.

The present invention is based on the discovery that surface charges that build up as a result of a current passing through an insulated conductor tent to randomly distribute over the length of the conductor. The randomly distributed surface charges produced an adverse effect upon the current. More specifically, the sharply defined edges of a rapidly varying electrical signal tend to spread, causing a waveform distortion. If the current is an audio signal, the transient characteristic of the system would be adversely affected leading to the loss of sharp, crisp sound over the full range of audio spectrum. The invention also applies to any surface insulated electrical circuit elements where surface charges build up as a result of a current that passes through the insulated inner component part or parts of the element.

SUMMARY OF THE INVENTION

The present invention contemplates to application of a coating of electrically conductive material over the surface of an insulated wire or circuit element. This coating layer is composed of a mixture of electrically conductive fine particles and a binding agent in which the conductive particles are suspended. This mixture, normally in a liquid state when sealed against exposure to the air, solidifies upon application to the surface of an article and tends to permeate into the depth of an insulated material that surrounds an inner conductor, so that the otherwise randomly distributed surface charges spread evenly over the length of the coated surface while establishing a gradually varying surface potential as a function of distance from the surface toward the inside. Because of the uniform distribution of charges and their continuous potential gradient near the insulated surface, the current passing through the insulated conductor is unaffected even if it rapidly changes in amplitude, thus eliminating waveform distortion.

BRIEF DESCRIPTION OF THE DRAWINGS

The invention will be further described by way of example with reference to the accompanying drawings, in which.

DETAILED DESCRIPTION

The electrically conductive coating material employed in the present invention comprises a mixture of about 50% by weight of carbon in the form of fine particles and about 50% by weight of cellulose as a binding material in which the conductive carbon particles are dispersed, the mixture being mixed in a solution comprising, for example, a ketone such as methylethylketone. The conductive coating material in the form of such solution, when applied to the surface of an insulating material and allowed to set, forms a conductive layer with a strong power of adhesion to the insulating surface. Since ketone emits an unpleasant odor when it is exposed to the air, the mixed solution preferably contains a certain amount of perfume or similar substance to mask the unpleasant odor.

Figure 1:
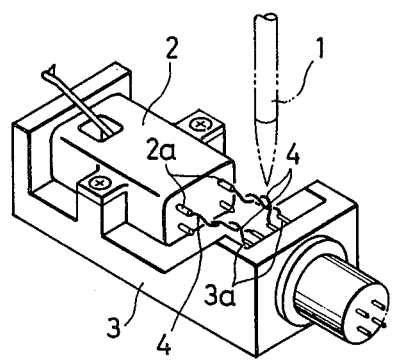
FIG. 1 is an illustration describing the application of the conductive solution of the invention to an insulated surface.
Figure 2A:
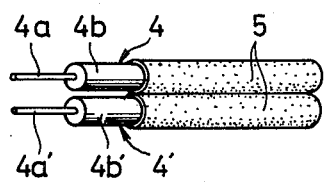
FIG. 2, shown separately in FIGS. 2a and 2b, is an enlarged, partial view of an end portion of insulated wires with an electrically conductive layer being coated thereon.
FIG. 2c is a cross-sectional, enlarged view of the wire of FIG. 2a or 2b.
Figure 2B:
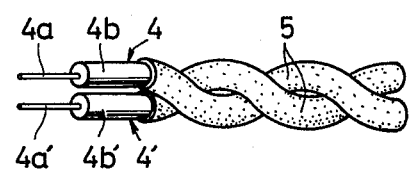

In FIG. 1, the conductive solution is being applied by means of a paint brush 1 to the surface of insulator-coated, twisted pairs of wires 4 connecting the terminals 2a of a pickup cartridge 2 to the terminals 3a of a head shell 3. As shown in FIG. 2b, care should be taken to assure that the applied conductive coating 5 does not extend to the end portions of the insulator coating 4b, 4b' adjacent to the wires 4a, 4a' to provide precaution against the wires being short-circuited. The same applies to a pair of non-twisted, parallel wires as illustrated in FIG. 2a.

Figure 2C:
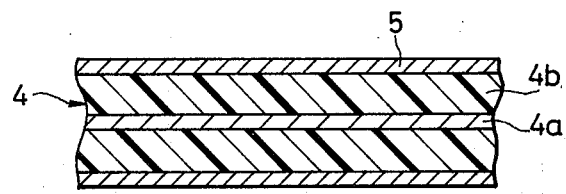

FIG. 2c is an enlarged, longitudinal, partial sectional view of the insulated wire 4 or 4'. The conductor 4a is shown coated with an insulator 4b which is in turn coated with the conductive layer 5. The layer 5 is applied at a uniform thickness over the surface of the insulator 4b. Although not shown, the conductive layer 5 penetrates partly into the insulator 4b so that the latter is provided with a dielectric constant which gradually increases toward an outer surface thereof.

This gradually varying dielectric constant, rather than the conventional discretely varying dielectric constant, permits charges to develop in gradually varying density in transverse cross-section, while the conductive layer assures uniformity in charge density along the length of the conductor through which a current of rapidly varying amplitude is passed. This uniformity of charges along the length of the insulator surface significantly improves the quality of sound if the coating is applied to audio equipment parts including lead wires within a tone arm, conductors leading to loudspeakers or between separate amplifier units and to conductors used inside of each amplifier or similar unit. By providing a connection to ground from the coating layer 5, the latter provides a good shielding effect.

Figure 3:
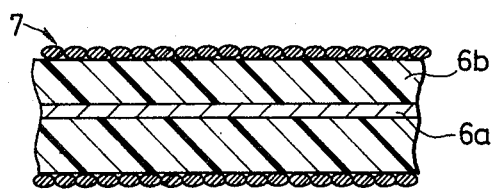
FIG. 3 is a cross-sectionl, enlarged view of a conventional shielded wire useful for describing the disadvantage of the prior art meshed structure of shielding.

The favorable effect provided by the invention could not be obtained by conventional shielded wires where an insulated conductor is surrounded by a mesh structure of fine wires as illustrated in FIG. 3. Because of the mesh structure of fine wires 7, tiny air gaps are formed therebetween as well as between the wires and the insulator 6b surrounding the conductor 6a, so that charges tend to build up in discretely spaced apart locations. It is found that some of the locations have a strong tendency toward being charged, while other exhibit a tendency to provide very high mobility to charges, causing distortion of a signal as it passes the conductor 6a near the discretely charged insulator 6b.

Figure 4A:
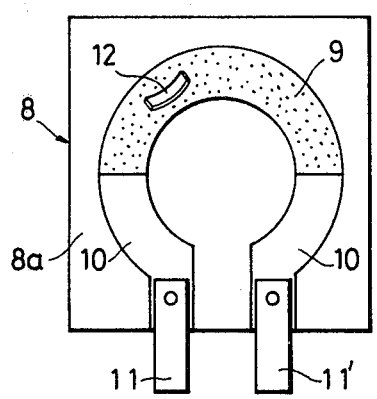
FIGS. 4a and 4b are illustrations of a variable resistor embodying the present invention.
Figure 4B:
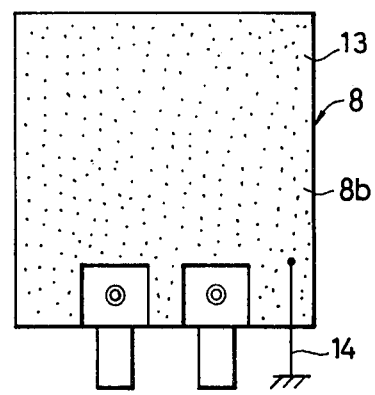

The electrical characteristic of a variable resistor can be improved by application of the conductive coating. FIGS. 4a and 4b are illustrations of a variable resistor according to the invention. On one surface 8a of an insulator base member 8, FIG. 4a, is mounted a horseshoe shaped element comprising a resistance section 9, formed of a resistive material such as carbon, and conductive sections 10 connected to the opposite ends of the resistance section 9. A pair of terminals 11 is connected respectively to the conductive sections 10 for connection to external circuitry. A contact point 12 of a wiper slider arm, not shown, is in contact with the resistance portion 9 in the conventional manner. To the opposite surface 8b, FIG. 4b, of the base member 8 is applied the conductive coating layer 13 except for areas adjacent the terminals 11 to avoid a short-circuit thereacross. The conductive layer 13 may be connected to ground as by a conductor 14.

Figure 5:
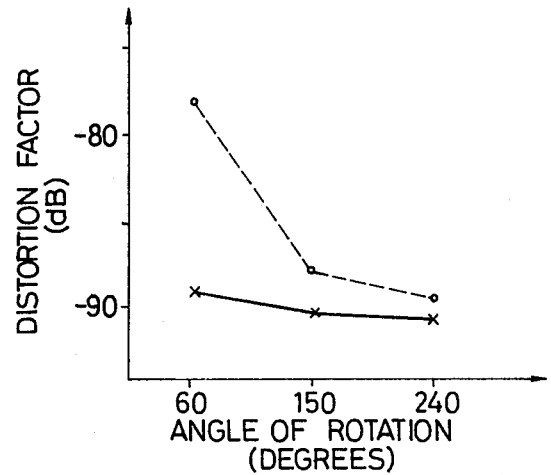
FIG. 5 is a graphic illustration of the distortion factor of the variable resistor of FIGS. 4a, 4b for making a comparison with a prior art counterpart.

The conductive layer 13 has the effect of providing uniform density charges which result from the passage of current through the horse-shoe section as described previously. As shown in FIG. 5, the distortion factor of a third higher harmonic of signals through the variable resistor is improved by the present invention. The improved distortion of a variable resistor to which the conductive coating has been applied is indicated by a solid-line curve, in contrast with a broken-line curve which is obtained with respect to the variable resistor to which the conductive coating has not been applied.

The conductive coating can be applied to any insulator surface of various electrical circuit elements as illustrated in FIGS. 6 to 12.

Figure 6:
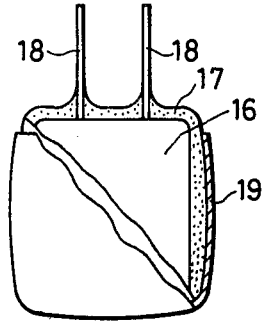
FIGS. 6–12 are illustrations of various electrical circuit elements and components embodying the present invention.

FIG. 6 is an illustration of a capacitor in partial cross-section. Numeral 16 indicates the capacitor proper which is enclosed by an insulator 17 through which a pair of conductors 18 extends. Numeral 19 is the conductive coating which is applied by the substantial part of the surface of the insulator 17 with the exception of areas adjacent to the conductors 18.

Figure 7:
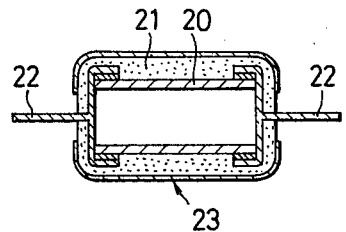

FIG. 7 is an illustration of a fixed value resistor in cross-section. A resistance element 20 in a cylindrical shape is embedded in an insulator material 21 with a conductor 22 attached to each end of the cylindrical resistance element 20. The conductive coating 23 is provided over the surface of the insulator 21 leaving portions surrounding the conductors 22.

Figure 8:
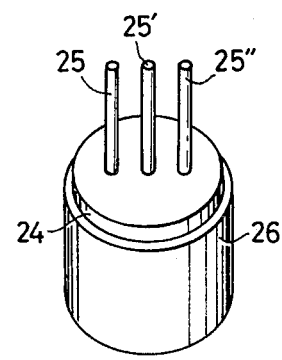

FIG. 8 is an illustration of a transistor enclosed by an insulator 24 with conductors 25, 25', 25" extending from the terminals of the transistor. The conductive coating 26 is shown surrounding the insulator surface.

Figure 9:
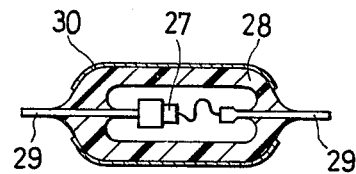

FIG. 9 is a cross-sectional view of a diode including a diode element 27 mounted within an insulator case 28 with a conductor 29 being attached to each terminal of the diode element 27. The conductive coating 30 is applied to the outer surface of the insulator case 28 without making contact with the conductors 29.

Figure 10:
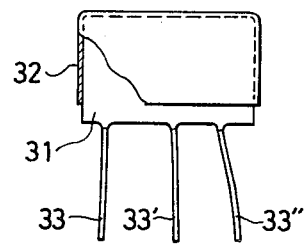

FIG. 10 is an illustration of a circuit component which is a combination of a plurality of basic circuit elements such as diode and capacitor housed in a common casing 31 of an insulating material. The conductive coating 32 is applied to the insulator casing 31 without making contact with lead wires 33, 33' and 33".

Figures 11, 12:
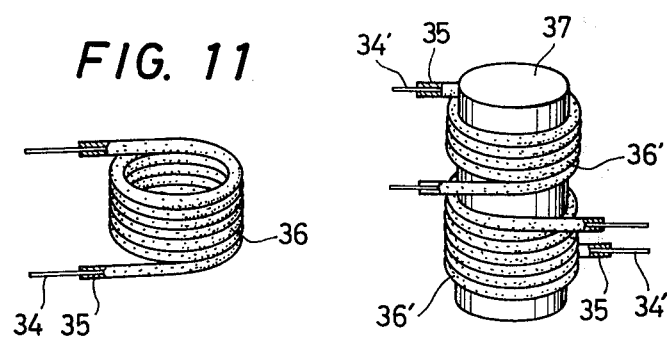

FIG. 11 is an illustration of an insulated coil with a conductor 34 coated with an insulator 35. The conductive coating 36 is applied to the surface of the insulated conductor. FIG. 12 is an illustration of a transformer embodying the coil structure of FIG. 11 wound on a core 37.

What is claimed is:

1. An electrical circuit element having at least one conductor adapted for passing audio signals therethrough, said circuit element being covered with a layer of an insulating material, comprising a layer of a carbon-containing material having a volume resistivity higher than the volume resistivity of said conductor and lower than the volume resistivity of said insulating material and surrounding and intimately contacting the outer surface of said layer of insulating material, said carbon-containing material partially penetrating into said layer of insulating material to provide a gradual variation of dielectric constant in the transverse cross-section of said layer of insulating material toward the outer surface thereof and making no electric contact with said conductor.

2. An electrical circuit element as claimed in claim 1, wherein said carbon-containing material comprises a mixture of carbon and cellulose, the carbon being in the form of fine particles dispersed in the cellulose acting as a binding agent.

3. An electrical circuit element as claimed in claim 2, wherein said mixture comprises about 50 percent by weight of carbon and about 50 percent by weight of cellulose.

4. An electrical circuit element as claimed in claim 2 further comprising adhering means for adhesively bonding said carbon containing material to said insulating material.

5. An electrical circuit element as claimed in claim 4 wherein said adhering means comprises a solution including a ketone.

6. In an electrical circuit element having a portion for passing time varying signals therethrough and a layer of insulating material of particular dielectric constant covering said portion, the improvement comprising:
a layer of electrically conductive material comprised of a mixture of electrically conductive particles suspended in a binding agent in contact with said layer of insulating material for providing a uniform dispersal of electrical charges within said layer of insulating material to reduce distortion of said time varying signals passing through said element, said electrically conductive particles comprising carbon and said binding agent comprising cellulose.

7. An electrical circuit element as claimed in claim 6 wherein said electrically conductive particles are disposed on said layer of insulating material so that a dielectric constant gradually varying toward an outer surface is provided.

8. An electrical circuit element as claimed in claim 6 wherein said electrically conductive particles partially permeates said layer of insulating material.

9. In an electrical circuit element having a portion for passing time varying signals therethrough and a layer of insulating material of particular dielectric constant covering said portion, the improvement comprising:
a layer of electrically conductive means comprised of a mixture of electrically conductive particles suspended in a binding agent for providing a uniform dispersal of electrical charges within said layer of insulating material to reduce distortion of said time varying signals passing through said element, said electrically conductive particles being in solution with an adhering means for bonding said electrically conductive means to said layer of insulating material.

10. An electrical circuit element as claimed in claim 9 wherein said adhering means comprises a ketone.

* * * * *